United States Patent
Schie et al.

(10) Patent No.: US 9,231,590 B1
(45) Date of Patent: Jan. 5, 2016

(54) TRIM METHOD FOR HIGH VOLTAGE DRIVERS

(71) Applicants: David Schie, Cupertino, TX (US); Mike Ward, Tallmadge, OH (US); David Spady, San Jose, CA (US)

(72) Inventors: David Schie, Cupertino, TX (US); Mike Ward, Tallmadge, OH (US); David Spady, San Jose, CA (US)

(*) Notice: Subject to any disclaimer, the term of this patent is extended or adjusted under 35 U.S.C. 154(b) by 0 days.

(21) Appl. No.: 14/214,716

(22) Filed: Mar. 15, 2014

(51) Int. Cl.
*H03K 19/0175* (2006.01)
*H03K 19/003* (2006.01)
*H03K 19/00* (2006.01)
*G05F 3/02* (2006.01)

(52) U.S. Cl.
CPC .............. *H03K 19/0005* (2013.01); *G05F 3/02* (2013.01)

(58) Field of Classification Search
None
See application file for complete search history.

(56) References Cited

U.S. PATENT DOCUMENTS

| | | | | |
|---|---|---|---|---|
| 7,880,452 B1* | 2/2011 | Prasad | ...................... | G05F 1/56 323/282 |
| 2006/0044007 A1* | 3/2006 | Lou | ...................... | H04L 25/0278 326/30 |
| 2009/0243713 A1* | 10/2009 | Marinca | ...................... | G05F 3/30 327/542 |
| 2014/0028376 A1* | 1/2014 | Marinca | ...................... | G05F 3/30 327/513 |

* cited by examiner

*Primary Examiner* — Jany Richardson
(74) *Attorney, Agent, or Firm* — Weiss & Moy, P.C.; Jeffrey D. Moy

(57) ABSTRACT

Methods and circuits are provided to create small, power minimizing, multi-channel high voltage drivers for microelectromechanical systems (MEMS). A resistor calibration circuit is introduced to allow on chip resistor dividers to be calibrated against a single precision high voltage resistor divider, eliminating the cost and printed circuit board real estate associated with multiple resistor dividers connected to each channel. Additionally, a multiple-power rail configuration is provided to reduce power to the overall system by producing several rails generated by a boost converter or a capacitive charge pump, where the voltage output of the rails is produced to group rails of lesser voltage requirement rather than connecting all channels to the same high voltage rail on a dynamic basis.

16 Claims, 4 Drawing Sheets

TRIM METHOD FOR HIGH VOLTAGE DRIVERS

CROSS-REFERENCE TO RELATED APPLICATION

This application claims priority of U.S. Provisional Patent Application Ser. No. 61/786,310 filed Mar. 15, 2013, which is incorporated herein by reference

FIELD OF THE INVENTION

The present invention in general relates to electronic components and in particular to methods and circuits to create small, power minimizing, multi-channel high voltage drivers for micro-electromechanical systems (MEMS).

BACKGROUND OF THE INVENTION

Microelectromechanical systems (MEMS) is the technology of very small devices, that merge at the nano-scale into nanoelectromechanical systems (NEMS) and nanotechnology. MEMS are made up of components between 1 to 100 micrometers in size (i.e. 0.001 to 0.1 mm), and MEMS devices generally range in size from 20 micrometers (20 millionths of a meter) to a few millimeters (i.e. 0.02 to >1.0 mm). MEMS usually consist of a central unit that processes data (the microprocessor) and several components that interact with the surroundings such as microsensors. At these sizes, the standard constructs of classical physics are not always useful. Because of the large surface area to volume ratio of MEMS, surface effects such as electrostatics and wetting dominate over volume effects such as inertia or thermal mass.

MEMS are finding more and more applications in commercial, industrial, military and medical markets. Today microelectromechanical systems are used to drive such things as: i) micro-mirror arrays for optical switching applications; ii) piezo-electric transducers for ultrasound; iii) cholesteric molecules for sensing and no-power display applications; iv) gyroscopes; v) accelerometers; vi) radar and other switches; vii) microfluidic pumps; viii) camera and eye lenses; ix) biological microarrays; x) biological cells based sensors and transducers such as heart cell actuators, and various other mechanical assemblies.

While the applications for MEMS are as varied as the imagination, many MEMS applications share a common requirement for a high voltage interface IC or integrated circuit capable of driving and/or interfacing and/or generating high voltage precision waveforms with extreme accuracy, over large numbers of channels, in an area not so large as to eliminate the benefits of the microelectromechanical device whose primary benefit is usually to save space and power so as to be incorporated into portable or miniature products. They also are often deployed in applications which operate from batteries or for which power must be minimized and often the small size of the MEMs sensors produces a desire for small form factors for the interfaces, biasing circuits, and power supplies to be of practical use.

In most microelectromechanical systems, each high voltage MEMS driver channel has a high impedance (to keep currents low) resistor divider creating a low voltage tap point proportional to the high voltage output. The feedback tap point is in turn coupled to a precision amplifier, normally auto-zeroed or nulled, which in turn drives a transconductor or level shift in a closed loop to create an output on the driver channel in conformance with an analog voltage or digital to analog (D/A) commanded input. The command input could be from a digital interface, a voltage level, a pulse-width modulation (PWM) input, or a similar input known to those skilled in the art.

Unfortunately, high valued resistors of high precision and with tight drift and temperature specifications and high initial accuracy are very expensive and difficult to source. Furthermore, arraying large numbers of high valued resistors across a printed circuit board creates high impedance nodes which are sensitive to noise coupling and leakage and uses a lot of space. Often these noise sources are introduced by the switching power supplies, usually boost converters, residing on or near the MEMS driver circuitry. The result is that most MEMS drivers have poor accuracy, "glitching problems," poor power characteristics, and are often much larger than the MEMS devices they are trying to drive.

High voltage integrated circuits capable of coupling current onto a high voltage output with multiple channels are available. The high voltage integrated circuits accept either an analog input or a digital input and can command an output. In general high voltage integrated circuits either use internal resistors, in which case their relative accuracy is poor, especially over the drift of the process, or high voltage integrated circuits rely on an external resistor divider for each channel. Even if multiple on chip resistors are trimmed for good initial accuracy, a costly process, their drift and voltage coefficient specification is still relatively poor. Exotic materials like SiCr may be used, however, on-chip thermal drift between the different channels, chip topology and the drift of the material itself still do not meet the very tight accuracy requirements of many MEMS drivers or make the cost of such drivers prohibitive.

MEMs system which require multiple high voltage driver outputs also require a means by which to create the rails to drive those outputs. The power supplies required to generate high voltage rails from a low voltage battery can often be extremely large often requiring more than one stage due to the small duty cycle that would otherwise be required. Finally, most implementations of these power supplies are not monolithic and take up a great deal of space. The high voltage driver outputs pull their current from the highest voltage possible and therefore even if the required output voltage is small the power consumed is not reduced.

It would therefore be desirable to create a multichannel MEMS driver by which multiple channels in an integrated circuit may be trimmed against a single external precision low-drift resistor divider. Additionally, it would be desirable to incorporate the high-voltage rail generation control and switching circuitry on the integrated circuit to minimize electromagnetic interference (EMI) and printed circuit board (PCB) loops which can radiate and to save space. Finally, it would be desirable to be able to select rails for multiple outputs on a dynamic basis in conformance with the output voltage command so as to reduce the overall system power use (where rails lower than a given rail are grouped, and the rail sub-regulated to each channel). And finally, it would be desirable to monolithically include all of these components to save space and to utilize a dielectrically isolated process to isolate the power converter switching noise from the rest of the circuitry (ie. charge pumps and inductive boost converters).

SUMMARY OF THE INVENTION

Methods and circuits are provided to create small, power minimizing, multi-channel high-voltage drivers for microelectromechanical systems (MEMS). A resistor calibration circuit is introduced to allow on-chip resistor dividers to be calibrated against a single precision high-voltage resistor divider, eliminating the cost and printed circuit board real estate associated with multiple resistor dividers connected to each channel. Additionally, a multiple power rail configuration is provided to reduce power to the overall system by producing several rails generated by a boost converters and/or capacitive charge pumps, where the voltage rails are produced to group outputs of lesser voltage requirement rather than connecting all channels to the same high voltage rail. The rails for each individual channel can be selected dynamically as required.

BRIEF DESCRIPTION OF THE DRAWINGS

The present invention is further detailed with respect to the following drawings. These figures are not intended to limit the scope of the present invention but rather illustrate certain attributes thereof.

DESCRIPTION OF THE INVENTION

The present invention has utility as improved methods and circuits to create small, power minimizing, multi-channel high voltage drivers for micro-electromechanical systems (MEMS). A resistor calibration circuit is introduced to allow on chip resistor dividers to be calibrated against a single, low drift, precision, high-voltage resistor divider, eliminating the cost and required printed circuit board real estate associated with multiple resistor dividers connected to each channel. Additionally, a multiple-power rail circuit configuration is taught to reduce power to the overall system by producing several rails generated by a boost converter and/or a capacitive charge pump, where the voltage output of the rails is produced to group rails of lesser voltage requirement rather than connecting all channels to the same high voltage rail on a dynamic basis.

Figure 1:
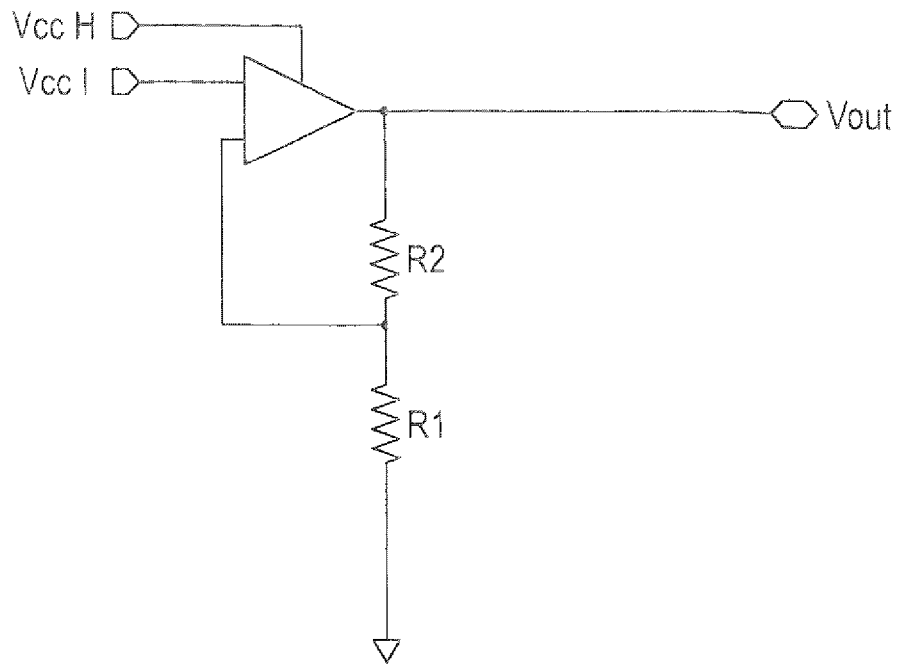
FIG. 1 is a schematic of a closed loop amplifier gain loop.

In embodiments of the invention, an integrated circuit device is introduced where two or more high voltage outputs are coupled to on chip resistor dividers. These resistor dividers, however, are each continuously calibrated against a single external low drift precision external resistor divider utilizing a novel calibration technique which calibrates the resistor accuracy, and calibrates out the effects of resistor leakage. The resulting inventive solution removes large numbers of precision, expensive, noisy and leakage prone external devices while overcoming the accuracy and drift short comings of on chip resistors. An embodiment of the inventive technique is described in more detail below:

FIG. 1 is a prior art schematic of an amplifier in a closed loop gain configuration. Operational amplifiers with resistive feedback have long been recognized as one of the best ways to amplify an analog signal. The operational amplifier configuration of FIG. 1 is a non-inverting gain configuration. Assuming the operational amplifier of FIG. 1 does not have an input offset voltage, the output of this circuit is determined by equation 1:

$$V_{OUT} = V_{IN} \cdot \left(1 + \frac{R_2}{R_1}\right) \quad (1)$$

Figure 2:
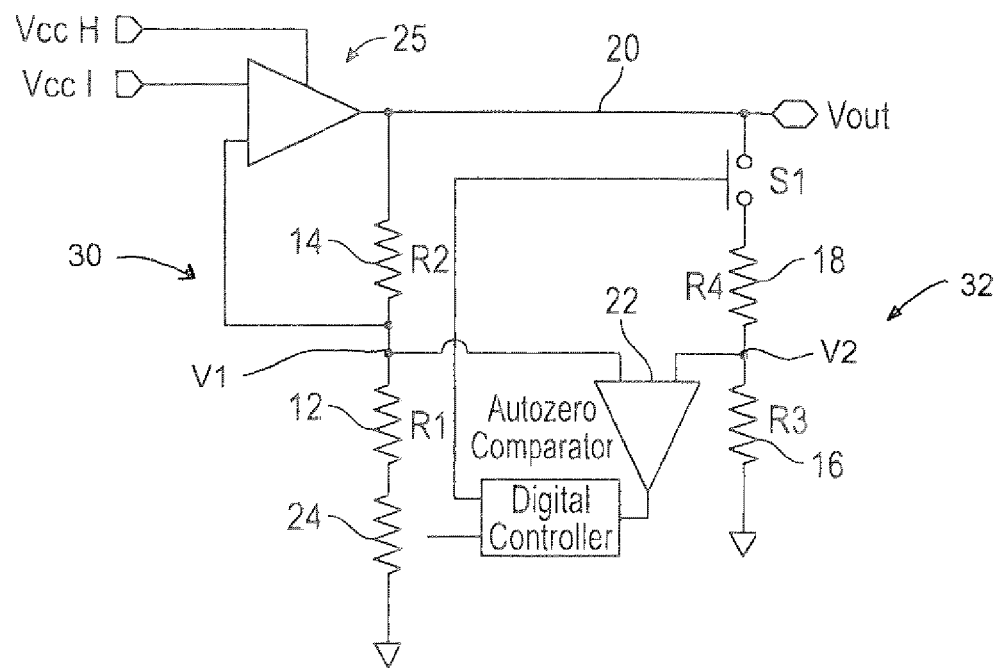
FIG. 2 is a schematic of a calibration circuit according to an embodiment of the invention.

In order to ensure the accuracy of the output, resistors R1 and R2 must be very accurate. This burden is heightened when the ratio of R2 to R1 becomes large and when the output voltage, $V_{OUT}$ becomes large. This is especially challenging when integrating the feedback resistors onto an integrated circuit where resistors usually have relatively high voltage-coefficients and temperature-coefficients. One existing solution to this problem is to use external $R_1$ and $R_2$ resistors and calibrate the resistors to eliminate their matching errors. While this solution can be successful, it requires two external resistors for each channel, where the number of channels typically number in the tens, hundreds or thousands. Also, this solution does not lend itself well to integrating the feedback resistors onto an integrated circuit as high quality, high-voltage integrated resistors are rare. Furthermore, while this calibration method could be used with integrated resistors, typically the voltage-coefficient and temperature coefficients of integrated resistors would render the calibration process excessively time consuming and complicated as the number of calibration coefficients would be very large and must be measured over both output voltage and system temperature. Based on the aforementioned implementation obstacles, it would be desirable to have an integrated solution with many amplifiers on one die, whose integrated feedback resistors are calibrated in real-time to one pair of external resistors. This would allow for a significant component reduction while maintaining a high level of system accuracy. FIG. 2 shows the inventive implementation of this circuit.

Figure 3:
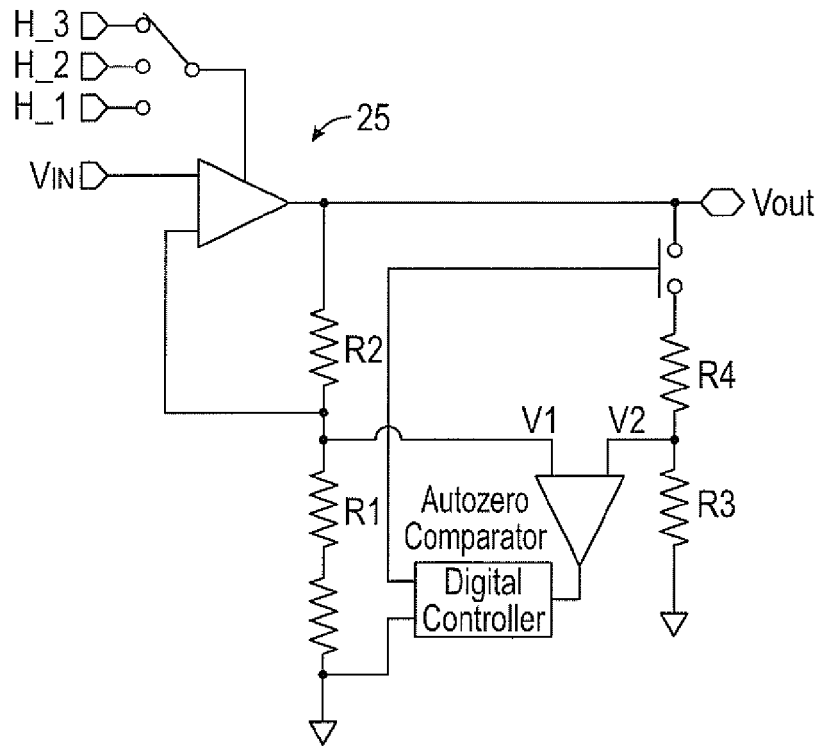
FIG. 3 is a schematic of a calibration circuit with a multiple rail connection according to an embodiment of the invention.

FIG. 2 is a schematic of a channel connected coupled calibration circuit 10 according to an embodiment of the invention. Resistors $R_1$ (12) and $R_2$ (14) are the internal feedback resistors. Resistors $R_3$ (16) and $R_4$ (18) are the external resistors which $R_1$ (12) and $R_2$ (14) will be calibrated to. The output voltage is created through (25) which represents a voltage output but could also be a transconductor with mirrored current output coupled into each of the resistor dividers 30, 32. FIG. 2 further shows S1 which may be extended to a multiplexer to the calibration circuitry for a larger number of channels according to an embodiment of the invention. FIG. 3 further shows an example of three different power rails operating coupled to (25). The selection of the voltage rail in FIG. 3 is determined by a controller which sets the rail from the boost converter or charge pump just above that required by the commanded voltage output The method of calibration is as follows:
1. Switch S1 is closed connecting the external resistors (16, 18) to the output of the channel 20.
2. An auto-zero window comparator 22 is used to compare the tap point on the external resistors, V2, with the internal feedback resistor tap point, V1.

3. Based on the output of the comparator 22, the internal R1 resistor is trimmed 24 upwards or downwards until the difference between V1 and V2 is within the window (hysteresis) of the comparator.

Figure 7:
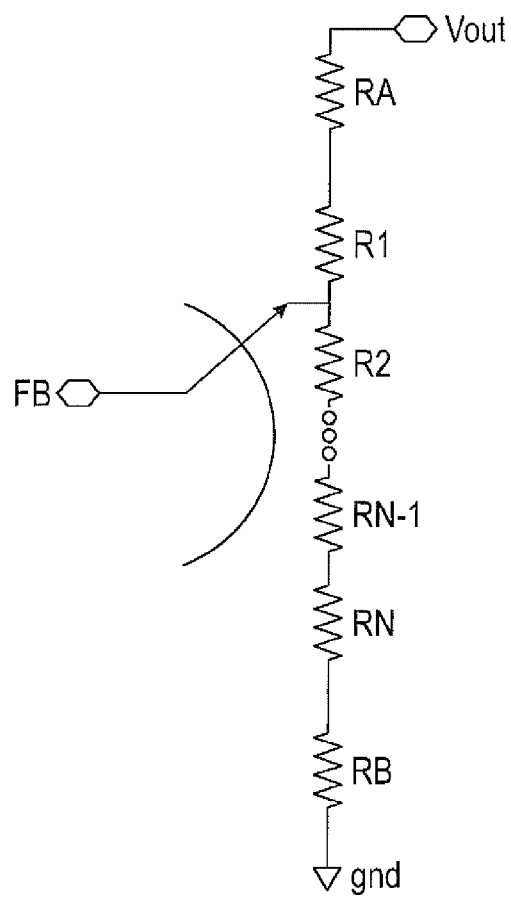
FIG. 7 is a schematic of a resistor trim circuit according to an embodiment of the invention.

FIG. 7 is a schematic of resistor trim circuit according to an embodiment of the invention. FIG. 7 shows one embodiment of a possible resistor trim method but many others are known to those skilled in the art. In this example, the feedback resistor consists of two primary resistors, RA and RB, and a series of trim resistors, R1 to RN. The trim resistors, R1 to RN, are much smaller than the primary feedback resistors. The FB node may be connected to any tap point along the R1, RN string of resistors by means of a low-voltage CMOS switch. By changing the tap-point on the resistor string, the resistor ratio is trimmed.

Figure 4:
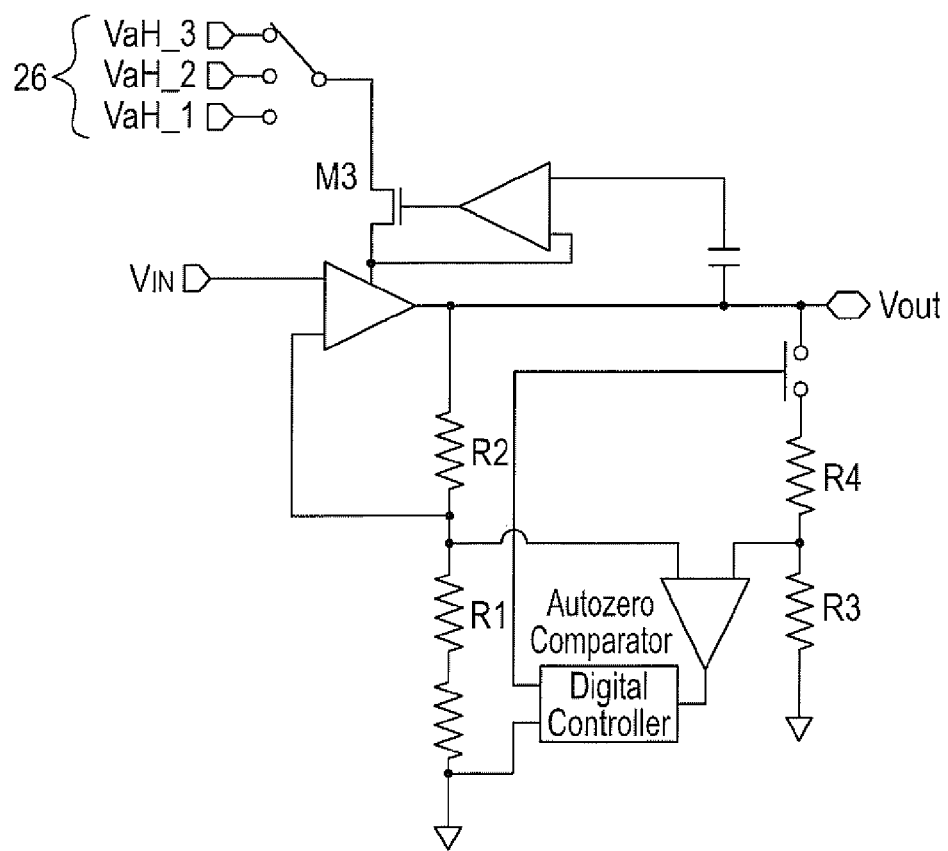
FIG. 4 is a schematic of a channel muxed to calibration with a regulator between the input rail and channel according to an embodiment of the invention.

Additionally, in order to improve the power consumption of the amplifier, it is desirable to have multiple high-voltage power supply rails to choose from. In order to accommodate this requirement, the operational amplifier is sub regulated such that when power supply for the operational amplifier is changed, the output of the amplifier is not disturbed. FIG. 4 is an implementation of this technique. It shows a channel multiplexed to a high-voltage rail with a sub-regulator between the between the high-voltage rail and the internal rail of the amplifier according to an embodiment of the invention. A digital or analog command device sets the voltage channel 26 in conformance with the desired output voltage. A controller acts to: i) group channels which are commanded to an output voltage together such that all the rails with similar voltage outputs or lower output voltages but above any other rail output voltage may be run off a single rail set just above the voltage of the highest commanded voltage in the group where the number of groupings equals the number of possible rails; ii) calculates the required voltage on each rail and dynamically establishes the output voltage of each rail.

Although the movement of the high voltage rails may be easily accomplished by changing the feedback of the boost converter and or charge pumps creating the rails, the transient involved with this movement may couple through the voltage output or current mirror outputs of the devices setting the output rail voltages. To decouple these movements from those outputs a sub regulator may be used as in FIG. 4 where the high voltage rails are set by a follower. In this case an n-channel device is used as the follower which results in a high impedance to any ac signals introduced on its drain by the movement of the supply rail voltage magnitudes.

Semiconductor devices such as integrated MOSFETs tend to grow substantially in size according to the voltage they have to block. High voltage MOSFETs also tend to have poor matching characteristics. It is therefore a common technique in high voltage processes to create isolated tubs in which lower voltage devices may float relative to other parts of the circuit. In other words, the components form low voltage "slices" which may operate in a small region or slice within a few volts of a voltage supply input but would be damaged if more than an allowed voltage were placed across the devices. Such slices may be accomplished through junction or dielectric isolation and are well known to those skilled in the art. These slices may be moved around relative to one another. Although multiple rails may be used to operate multiple channels the voltage must be higher than the highest voltage commanded output in the group, and the voltage on other slices in the group must still be sub-regulated from that supply rail so as not to damage slices further away from the rail. This is another reason, in addition to the noise decoupling during rail movements, to include a sub-regulator.

Figure 5:
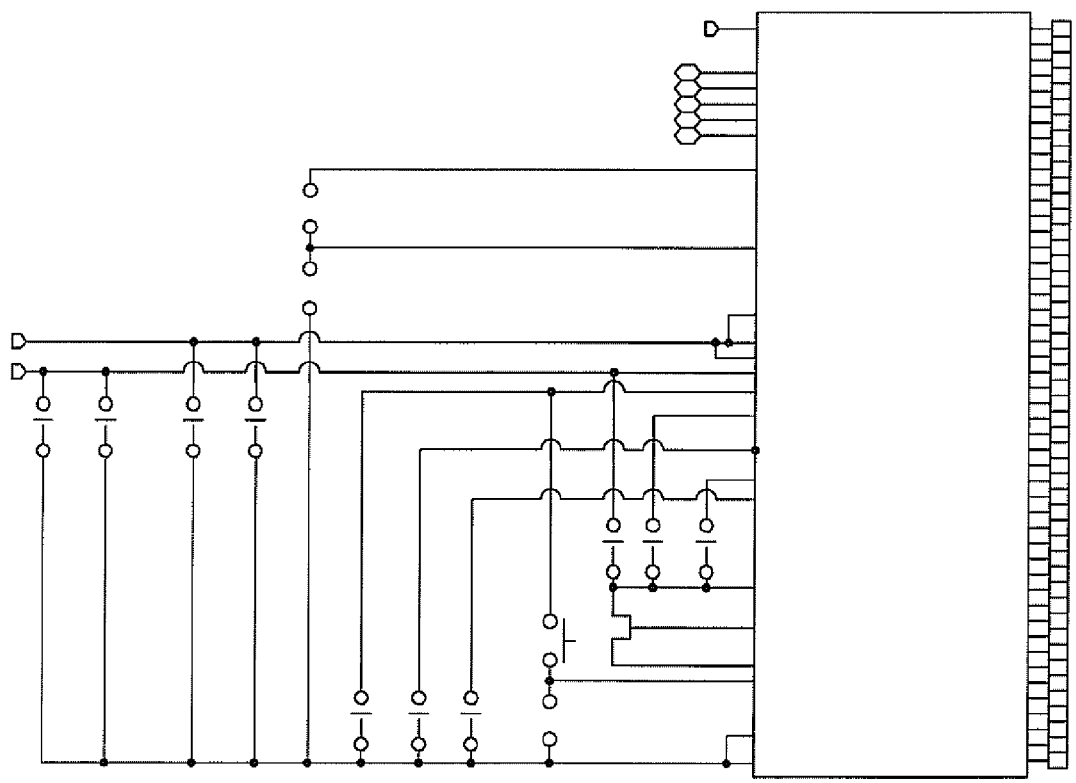
FIG. 5 is a schematic of a complete multichannel MEMS driver solution including internally generated multiple supply rails according to an embodiment of the invention.
Figure 6:
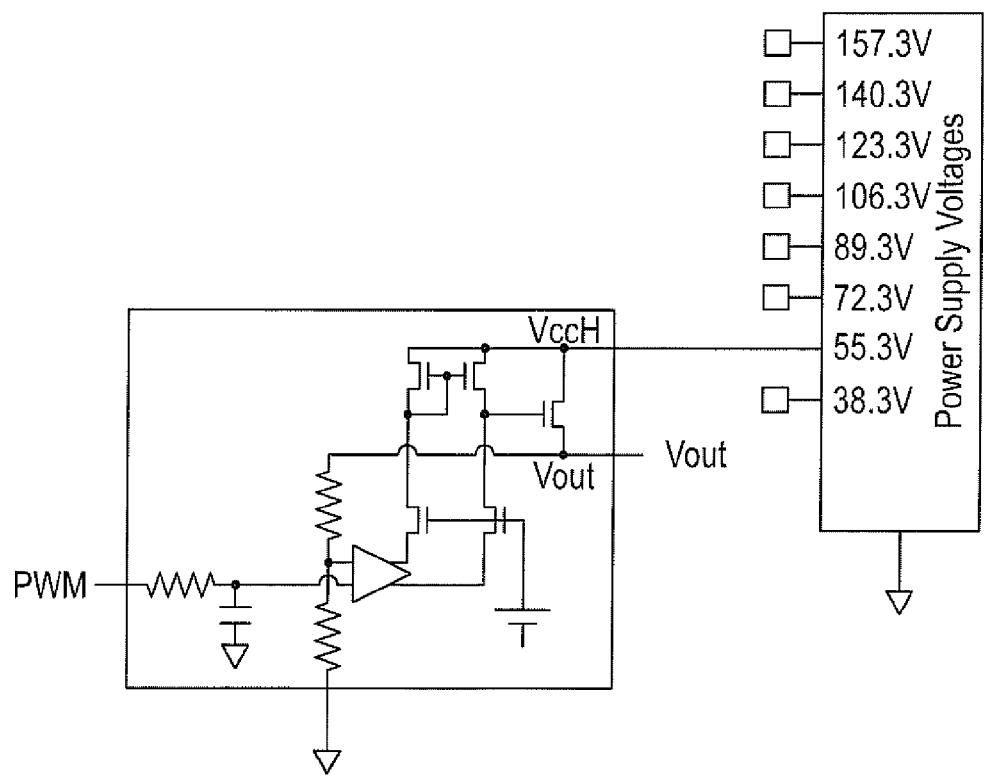
FIG. 6 is a schematic of a channel connected to one of multiple supply rails according to an embodiment of the invention.
Figure 8:
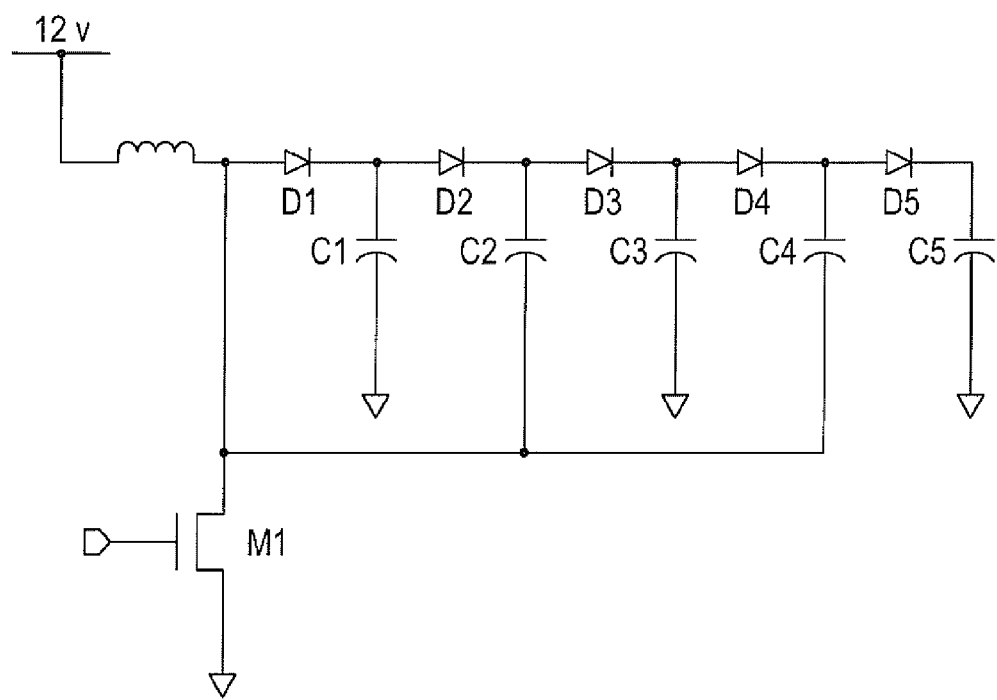
FIG. 8 is a schematic of a boost integrated circuit configuration with charge pump stages according to an embodiment of the invention.

In inventive embodiments multiple rails are generated on the same chip so as to reduce the EMI loops on a standard printed circuit board (PCB). This is best, although can be accomplished without, using a dielectrically isolated process which is capable of isolating the noise of the switching power supply from other circuits on the same monolithic die. The circuitry includes a controller, feedback means (which can be calibrated using the same external precision reference as the other channels), and a combination of boost and charge pump stages depending upon the number of rails desired. FIG. 5 is a schematic of a complete multichannel MEMS driver solution including internally generated multiple supply rails according to an embodiment of the invention. FIG. 6 is a schematic of a channel connected to one of multiple supply rails according to an embodiment of the invention. FIG. 7 shows a possible means for resistor divider adjustment. FIG. 8 is a schematic of a boost integrated circuit configuration with charge pumps according to an embodiment of the invention.

There are multiple ways to implement embodiments of the invention including differing loop configurations, feedback combinations or coupling techniques that are known to those skilled in the art and which might be used as an alternative to elements of the above methods and circuits without altering the innovation taught herein.

There are multiple ways to implement the calibration sequence including continuously calibrating one channel, periodically calibrating one channel, rotating through and calibrating each channel in sequence continuously, calibrating each channel when its output value is changed, or any other method deemed optimal.

There are multiple ways of implementing the high-voltage operational amplifier. It could be implemented with a low-voltage input stage followed by a folded cascode stage to a high-voltage output stage. Alternatively, it could be implemented with a low-voltage input operational amplifier driving a transconductor which in turn drives a high-voltage current mirror which is then used to set the current through the high-side feedback resistor and can be mirrored to outputs coupled to other dividers. There are many implementations of high-voltage operational amplifiers known to those skilled in the art.

As mentioned, it would be desirable to save power by generating multiple high voltage rails such that groups of outputs of lower expected output voltage may be coupled to those rails to save power, rather than drawing all of their current from one high voltage rail which might be much higher than required, for all outputs. Generating multiple high voltage rails usually requires multiple feedback loops and switches, some using the output of one of the previous stages as the input to the next stage. Instead, quadratic and doubling techniques might be used. As shown in FIG. 8 a single switch may be used to create multiple rails. One of the rails may be chosen for regulation and a wider variation in the other rails accepted. By further incorporating the feedback, driver and switch components monolithically, the overall system size may be reduced substantially compared to using external discrete components. Although a single boost converter stage and multiple doubler (charge pump) stages are shown, the replacement of any of D2/C2 or D4/C4 with an inductor in series with a diode, where the drain of the switch were connected to the node connecting the inductor and diode would allow greater conversion ratios for the subsequent stages. In this figure, L1, M1, C1, and D1 form a traditional boost converter to create the voltage, V1. The capacitor, C2, and diodes D2 and D3 create a charge pump stage. Assuming the diode drops to be negligible with respect to V1, V2, and V3 simplifies the analysis of the circuit. The drain of M1 switches roughly between ground and V1. The capacitor, C2, pushes this voltage onto the cathode of D2 such that the cathode of D2 switches between roughly V1 plus V1. The voltage V2 is therefore roughly double V1. The C4 capacitor and the D4 and D4 capacitors act similarly such that V3 is equal roughly to V1 plus V2 or three times the V1 voltage. FIG. 8 shows one embodiment of a boost converter generating three high-voltage rails, however, this topology could be used to generate any number of such rails.

Switching circuits such as DC/DC converters (switching power supplies) or charge pumps tend to cause noise which couples through the substrate if included monolithically on an integrated circuit. This would be particularly problematic in the proposed circuit where high impedance on chip resistor dividers would be susceptible to noise coupled through the substrate. To reduce the probability of such noise coupling, a dielectrically isolated process may be used and isolated tubs created such that the switching circuits and the precision analog circuitry are isolated from each other.

The foregoing description is illustrative of particular embodiments of the invention, but is not meant to be a limitation upon the practice thereof. The following claims, including all equivalents thereof, are intended to define the scope of the invention.

The invention claimed is:

1. An integrated circuit driver for driving at least one accurate high-voltage outputs comprising:
   at least one high voltage driver channel output terminals;
   an external precision high impedance resistor divider coupled externally to said at least one high voltage divider channel output terminals;
   an internal resistor divider coupled to said at least one high voltage divider output terminals; and
   a resistor calibration circuit;
   wherein said one or more internal resistor dividers are calibrated in conformance with said external precision high impedance resistor divider until a voltage on a set of divider taps match.

2. The integrated circuit driver of claim 1, wherein said resistor calibration circuit comprises:
   a high impedance on chip resistor divider;
   a window comparator coupled to said external precision high impedance resistor divider and said internal resistor divider; and
   a voltage source output or pair of mirrored current source outputs whose magnitude conforms to a command from a controller, said voltage source output or said pair of mirrored current source outputs coupled to said internal resistor divider and said external precision high impedance resistor dividers;
   wherein internal resistors are modified in conformance with said window comparator output to increase a tap point voltage or reduce the tap point voltage until the voltage on the internal resistor divider equals the voltage on the tap point of the external precision high impedance resistor divider as indicated when the voltage is within the hysteresis band of said comparator.

3. The integrated circuit driver of claim 2, wherein said window comparator has a positive magnitude output for increment, a negative magnitude output for decrement, and an intermediate magnitude output for equal or near equal voltage magnitude.

4. The integrated circuit driver of claim 1, wherein said resistor calibration circuit comprises:
   an internal high impedance monolithic resistor divider whose value is established by digital means;
   a window comparator coupled to said external precision high impedance resistor divider and said internal high impedance monolithic resistor divider;
   a said precision external resistor divider; and
   a voltage or pair of matched current sources with programmable magnitude coupled to a command input and to each of said internal and external resistor dividers, where said magnitude is adjusted in conformance with said input command to produce a command voltage on the external resistor divider;
   wherein said window comparator compares the voltage on the external precision high impedance resistor divider and said internal resistor dividers and increments or decrements the value of the internal resistor divider magnitude until two tap voltages match within the window comparator window (hysteresis).

5. The integrated circuit of claim 1 further comprising:
   at least one high voltage rail coupled to said high voltage driver channel output terminals;
   at least one high voltage power rail generator;
   a controller coupled to said at least one high voltage power rail generators; and
   a high voltage multiplexer;
   wherein said power rail voltages are dynamically established by said controller which further groups channels to be coupled to a given high voltage rail and then couples them to said given high voltage rails using said high voltage multiplexer so as to minimize total system power consumption.

6. The integrated circuit of claim 5 further comprising one or more boost converters, said boost converters included monolithically.

7. The integrated circuit of claim 6, wherein said boost converters are created in a dielectrically isolated process to isolate its switching noise from other circuits.

8. The integrated circuit of claim 5 further comprising at least one charge pump stages, said at least one charge pump stages included monolithically.

9. The integrated circuit of claim 8, wherein said at least one charge pumps stages are created in a dielectrically isolated process to isolate its switching noise from other circuits.

10. The integrated circuit of claim 8, wherein the at least one high voltage power rail generator creates multiple rails using a single switch and single feedback loop.

11. The integrated circuit of claim 5 further comprising a sub-regulator so as to create a sub-regulated voltage for each channel so as to isolate each channel from glitches associated with at least one of changing the magnitude of the high voltage rails and to produce output rails which conform to a maximum voltage that can be accommodated by selected semiconductor devices.

12. The integrated circuit of claim 5, wherein the at least one high voltage power rail generator creates multiple rails using a single switch and single feedback loop.

13. The integrated circuit driver of claim 1 further comprising a multiplexer connecting said external precision high impedance resistor divider to said resistor calibration circuit.

14. The integrated circuit of claim 1, wherein said internal resistor divider is multiplexed to said resistor calibration circuit in a continuous or periodic pattern so as to continuously calibrate said internal resistore divider.

15. The integrated circuit of claim 1, wherein said internal resistor divider are multiplexed to said resistor calibration circuit when commanded by an external controller provided either directly to a terminal or through a digital bus.

16. A precision multi-channel monolithic voltage regulation circuit comprising:

a closed loop amplifier;
a level shift;
an internal divider feedback network calibrated against an external precision resistor divider; and
wherein said closed loop amplifier couples a voltage to an output terminal utilizing said level shift or said transconductor in conformance with the calibrated internal divider feedback network.

* * * * *